（12）United States Patent
Wu et al.

(10) Patent No.: US 12,176,440 B2
(45) Date of Patent: Dec. 24, 2024

(54) SEMICONDUCTOR STRUCTURE WITH AN AIR GAP AND METHOD OF FORMING THE SAME

(71) Applicant: Winbond Electronics Corp., Taichung (TW)

(72) Inventors: Shang-Rong Wu, Taichung (TW); Ming-Che Lin, Taichung (TW); Chung-Hsien Liu, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 445 days.

(21) Appl. No.: 17/518,270

(22) Filed: Nov. 3, 2021

(65) Prior Publication Data

US 2023/0140646 A1 May 4, 2023

(51) Int. Cl.
*H01L 21/764* (2006.01)
*H01L 29/49* (2006.01)
*H01L 29/66* (2006.01)
*H01L 29/788* (2006.01)

(52) U.S. Cl.
CPC ........ *H01L 29/7881* (2013.01); *H01L 21/764* (2013.01); *H01L 29/4991* (2013.01); *H01L 29/66825* (2013.01)

(58) Field of Classification Search
CPC ... H01L 29/66825; H01L 29/788–7889; H01L 29/4991; H01L 21/764
See application file for complete search history.

(56) References Cited

U.S. PATENT DOCUMENTS

| 5,719,085 A * | 2/1998 | Moon | H01L 21/76235 |
| | | | 257/E21.549 |
| 6,465,325 B2 * | 10/2002 | Ridley | H01L 21/763 |
| | | | 257/E21.429 |
| 7,056,792 B2 * | 6/2006 | Lin | H10B 41/27 |
| | | | 257/E21.345 |
| 7,163,869 B2 * | 1/2007 | Kim | H01L 21/76224 |
| | | | 257/E21.546 |

(Continued)

FOREIGN PATENT DOCUMENTS

| TW | I581407 B | 5/2017 |
| TW | I597578 B | 9/2017 |

OTHER PUBLICATIONS

Chen, et al.; "Low alkaline contamination bottom antireflective coatings for both 193- and 157-nm lithography applications"; Published in 2003; Microelectronic Engineering 67-68 (2003) 312-318, 7 pages.

*Primary Examiner* — Maliheh Malek
(74) *Attorney, Agent, or Firm* — MUNCY, GEISSLER, OLDS & LOWE, P.C.

(57) ABSTRACT

A semiconductor structure and a method of forming the semiconductor structure are provided. The method of forming the semiconductor structure includes forming a floating gate layer on a substrate. A trench is formed in the floating gate layer and the substrate. A first dielectric layer is formed in the trench. A second dielectric layer is formed on the first dielectric layer. A third dielectric layer is formed on the second dielectric layer. A first sacrificial layer is formed on the third dielectric layer. A dielectric stack is formed on the first sacrificial layer. A control gate layer is formed on the dielectric stack. The first sacrificial layer is removed to form an air gap between the third dielectric layer and the dielectric stack.

19 Claims, 8 Drawing Sheets

(56) References Cited

U.S. PATENT DOCUMENTS

| | | | | |
|---|---|---|---|---|
| 7,364,975 B2* | 4/2008 | Culmsee | H01L 21/76229 | 257/E21.546 |
| 7,498,233 B2* | 3/2009 | Kim | H10B 41/30 | 438/257 |
| 7,659,159 B2* | 2/2010 | Lee | H10B 69/00 | 438/257 |
| 7,674,661 B2* | 3/2010 | Ahn | H01L 29/792 | 438/173 |
| 8,492,224 B2* | 7/2013 | Purayath | H10B 41/30 | 438/257 |
| 8,778,749 B2* | 7/2014 | Pachamuthu | H01L 21/764 | 438/257 |
| 8,865,562 B2* | 10/2014 | Lee | H01L 21/764 | 438/422 |
| 8,883,611 B2* | 11/2014 | Lee | H10B 43/35 | 438/421 |
| 8,962,444 B2* | 2/2015 | Kim | H10B 41/35 | 438/257 |
| 9,082,866 B2* | 7/2015 | Sakaguchi | H01L 29/42324 | |
| 9,293,360 B2* | 3/2016 | Cho | H01L 21/02203 | |
| 9,293,547 B2* | 3/2016 | Arai | H01L 21/764 | |
| 9,524,973 B1* | 12/2016 | Yoshida | H01L 21/764 | |
| 9,748,332 B1* | 8/2017 | Yang | H01L 29/0649 | |
| 10,418,440 B2* | 9/2019 | Liu | H10B 41/00 | |
| 10,566,337 B2* | 2/2020 | Liu | H01L 21/76224 | |
| 10,720,533 B2* | 7/2020 | Hsieh | H01L 21/32155 | |
| 10,840,382 B2* | 11/2020 | Hsieh | H01L 29/7883 | |
| 10,847,612 B2* | 11/2020 | Liu | H01L 29/40114 | |
| 11,309,433 B2* | 4/2022 | Chen | H01L 29/788 | |
| 2005/0258463 A1* | 11/2005 | Yaegashi | H10B 69/00 | 257/296 |
| 2005/0266647 A1* | 12/2005 | Kim | H10B 69/00 | 257/E21.546 |
| 2005/0287731 A1* | 12/2005 | Bian | H01L 29/42324 | 438/257 |
| 2006/0264003 A1* | 11/2006 | Eun | H10B 12/09 | 438/424 |
| 2007/0173005 A1* | 7/2007 | Lee | H01L 29/66772 | 257/E29.283 |
| 2007/0210403 A1* | 9/2007 | Sandhu | H01L 21/76229 | 257/E27.081 |
| 2007/0284650 A1* | 12/2007 | Willer | H10B 69/00 | 257/E21.679 |
| 2008/0003739 A1* | 1/2008 | Lee | H10B 41/30 | 438/257 |
| 2008/0003773 A1* | 1/2008 | Kwak | H01L 21/76224 | 257/E21.546 |
| 2008/0020534 A1* | 1/2008 | Culmsee | H01L 21/76229 | 438/296 |
| 2008/0206976 A1* | 8/2008 | Kitamura | H01L 29/40114 | 257/E27.103 |
| 2010/0224926 A1* | 9/2010 | Hatakeyama | H10B 41/10 | 257/E27.102 |
| 2010/0230741 A1* | 9/2010 | Choi | H01L 29/7881 | 257/E29.02 |
| 2012/0007165 A1* | 1/2012 | Lee | H01L 29/7881 | 257/E27.06 |
| 2012/0049266 A1* | 3/2012 | Oh | H10B 41/10 | 438/586 |
| 2012/0070976 A1* | 3/2012 | Kim | H10B 43/40 | 257/E21.209 |
| 2012/0074484 A1* | 3/2012 | Kang | H10B 41/40 | 257/E21.422 |
| 2012/0126303 A1* | 5/2012 | Arai | H10B 41/35 | 257/E21.209 |
| 2012/0132982 A1* | 5/2012 | Lee | H01L 29/40114 | 257/321 |
| 2012/0280300 A1* | 11/2012 | Kim | H10B 41/35 | 257/315 |
| 2013/0049085 A1* | 2/2013 | Lin | H10B 12/053 | 257/296 |
| 2013/0277730 A1* | 10/2013 | Jung | H10B 41/43 | 257/E21.546 |
| 2014/0021524 A1* | 1/2014 | Sim | H01L 21/76289 | 257/314 |
| 2014/0024192 A1* | 1/2014 | Kim | H01L 29/165 | 438/296 |
| 2014/0061757 A1* | 3/2014 | Kim | H01L 29/42332 | 438/259 |
| 2014/0138761 A1* | 5/2014 | Yagishita | H01L 21/764 | 257/326 |
| 2014/0151779 A1* | 6/2014 | Cho | H10B 41/30 | 257/316 |
| 2014/0252434 A1* | 9/2014 | Lee | H01L 29/66825 | 438/424 |
| 2015/0214291 A1* | 7/2015 | Park | H01L 24/02 | 257/503 |
| 2015/0236028 A1* | 8/2015 | Oh | H01L 29/0653 | 438/422 |
| 2015/0340373 A1* | 11/2015 | Lee | H01L 29/66825 | 438/424 |
| 2016/0190334 A1* | 6/2016 | Lee | H10B 41/30 | 257/506 |
| 2016/0260726 A1* | 9/2016 | Shin | H01L 21/823462 | |
| 2017/0287922 A1* | 10/2017 | Li | H01L 21/764 | |
| 2018/0096849 A1* | 4/2018 | Burke | H01L 29/7397 | |
| 2018/0308929 A1* | 10/2018 | Liu | H01L 29/0653 | |
| 2018/0366573 A1* | 12/2018 | Chou | H01L 29/66825 | |
| 2019/0081177 A1* | 3/2019 | Hsieh | H01L 21/32155 | |
| 2019/0148394 A1* | 5/2019 | Tsuda | H01L 21/76224 | 257/324 |
| 2019/0341449 A1* | 11/2019 | Liu | H10B 41/00 | |
| 2019/0385892 A1* | 12/2019 | Singh | H01L 21/3065 | |
| 2020/0052038 A1* | 2/2020 | Kim | H10N 70/8413 | |
| 2020/0105535 A1* | 4/2020 | Lin | H01L 21/823431 | |
| 2020/0286894 A1* | 9/2020 | Lin | H10B 12/0335 | |
| 2020/0388694 A1* | 12/2020 | Cheng | H01L 29/6653 | |
| 2020/0395238 A1* | 12/2020 | Cheng | H01L 29/66666 | |
| 2021/0074848 A1* | 3/2021 | Katou | H01L 29/407 | |
| 2021/0296486 A1* | 9/2021 | Chen | H01L 29/40114 | |
| 2021/0320172 A1* | 10/2021 | Yu | H01L 21/823481 | |
| 2022/0293512 A1* | 9/2022 | Lo | H01L 23/5222 | |
| 2022/0302266 A1* | 9/2022 | Kachi | H01L 29/0649 | |
| 2023/0335602 A1* | 10/2023 | Hsu | H10B 41/30 | |
| 2024/0222525 A1* | 7/2024 | Liu | H01L 29/788 | |

* cited by examiner

SEMICONDUCTOR STRUCTURE WITH AN AIR GAP AND METHOD OF FORMING THE SAME

BACKGROUND

Field of the Invention

The present disclosure relate to a semiconductor structure and a method for forming the same, and, in particular, to a semiconductor structure with an air gap, and a method for forming the same.

Description of the Related Art

A non-volatile memory includes a floating gate and a control gate. The floating gate is used to capture and store electrons, and the control gate is used to control the potential and connect to the word line. As the demand for use increases, semiconductor structures are scaled down to increase the density of the integrated density. However, reducing the sizes of the semiconductor structures may cause coupling interference between adjacent floating gates. That is, the interference between active regions is occurred. Or, a leakage current may be caused, resulting in a decrease in the reliability and yield of the semiconductor structure.

Therefore, there are still some problems to be overcome regarding the semiconductor structure that can be used as a non-volatile memory after further processing and the method of forming the same.

SUMMARY

The present disclosure forms an air gap between the third dielectric layer and the dielectric stack by sequentially disposing the first dielectric layer, the second dielectric layer, the third dielectric layer, and the dielectric stack in the trench. The air gap is used to avoid problems of the coupling interference and the leakage current. In particular, since the present disclosure uses a multilayer dielectric layer with a dielectric stack structure, when a wet etching is performed to form the air gap, the reliability of the semiconductor structure can be maintained. Thus, the reliability and the performance of the subsequently formed memory device can be improved.

A method of forming a semiconductor structure is provided. The method of forming the semiconductor structure includes forming a floating gate layer on a substrate. A trench is formed in the floating gate layer and the substrate. A first dielectric layer is formed in the trench. A second dielectric layer is formed on the first dielectric layer. A third dielectric layer is formed on the second dielectric layer. A first sacrificial layer is formed on the third dielectric layer. A dielectric stack is formed on the first sacrificial layer. A control gate layer is formed on the dielectric stack. The first sacrificial layer is removed to form an air gap between the third dielectric layer and the dielectric stack.

A semiconductor structure is provided. The semiconductor structure includes a substrate, a first dielectric layer, the second dielectric layer, the third dielectric layer and a dielectric stack. The substrate has a trench between a plurality of active regions. The first dielectric layer is disposed in the trench. The second dielectric layer is disposed on the first dielectric layer. The third dielectric layer is disposed on the second dielectric layer. The dielectric stack is disposed on the third dielectric layer. Wherein, an air gap is between the third dielectric layer and the dielectric stack.

DETAILED DESCRIPTION

Figure 14:
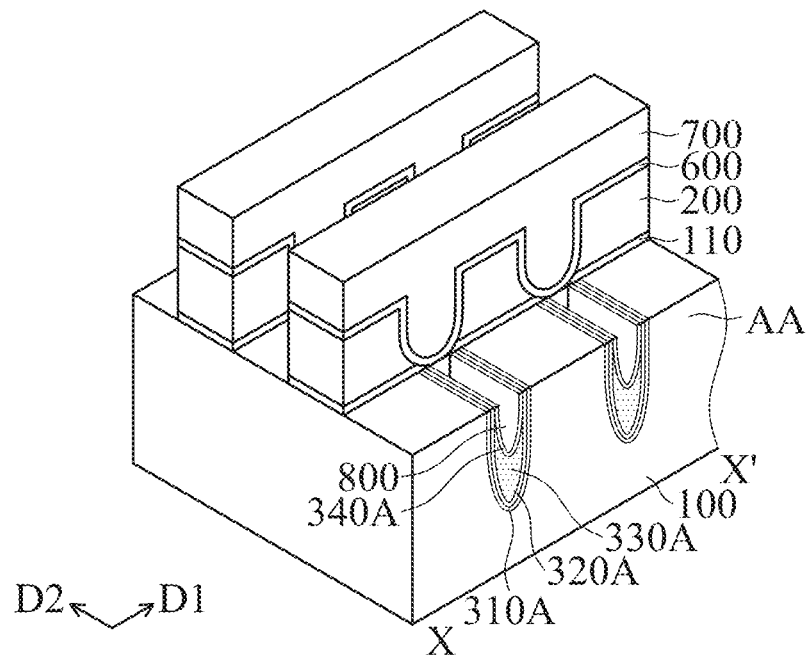
FIG. 14 is a schematic three-dimensional view of a semiconductor structure according to some embodiments of the disclosure.
Figure 15:
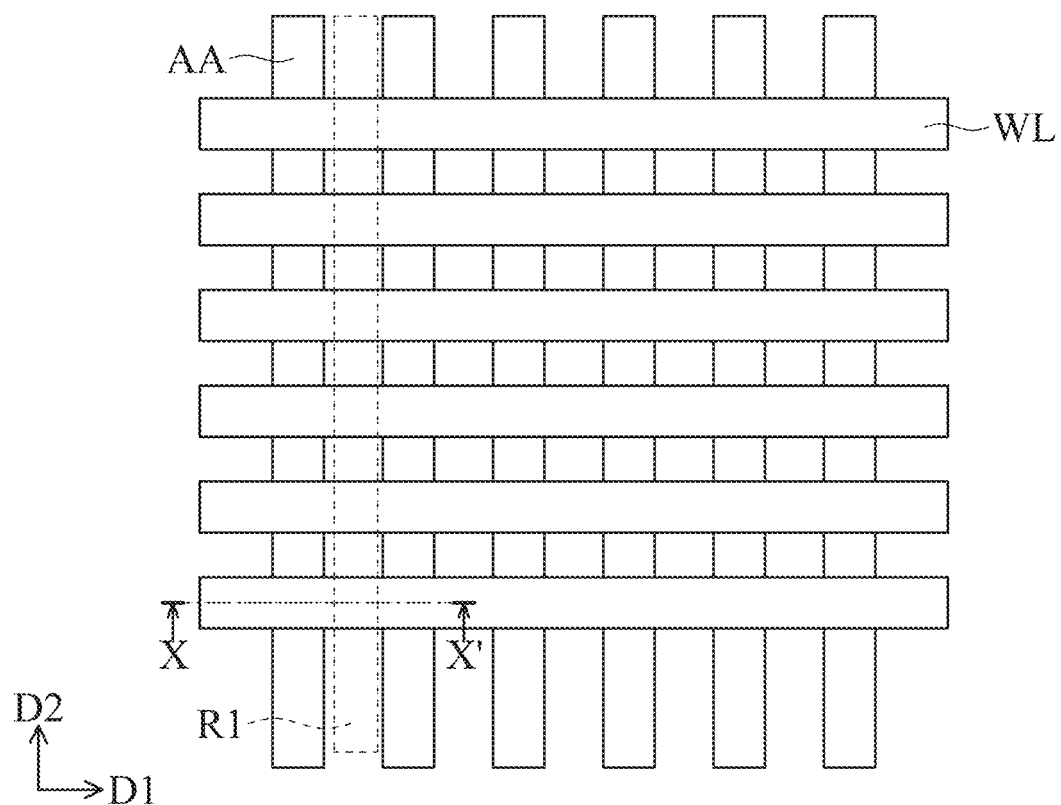
FIG. 15 is a schematic top view of a semiconductor structure according to some embodiments of the disclosure.

FIG. 1 to FIG. 11 and FIG. 13 are schematic cross-sectional views illustrating various stages of forming the semiconductor structure 1 according to some embodiments of the present disclosure. FIG. 12 is schematic three-dimensional view of FIG. 11. FIG. 14 is schematic three-dimensional view of FIG. 13. Furthermore, FIG. 15 is a schematic top view, and FIG. 1 to FIG. 11 and FIG. 13 are schematic cross-sectional views taken along the line XX' in FIG. 15.

Figure 1:
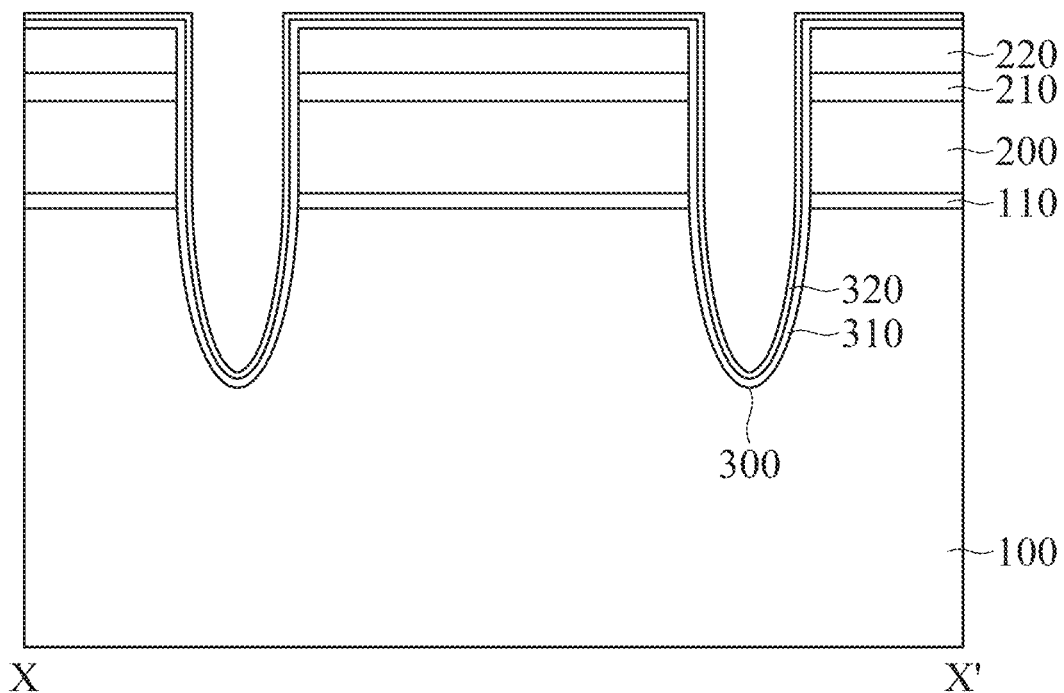
FIGS. 1-11 are schematic cross-sectional views of a semiconductor structure at various stages of formation, according to some embodiments of the present disclosure.

Referring to FIG. 1, a substrate 100 is provided. A tunneling dielectric layer 110, a floating gate layer 200, a first hard mask 210 and a second hard mask 220 are sequentially formed on the substrate 100. That is, the tunneling dielectric layer 110 is formed on the substrate 100, the floating gate layer 200 is formed on the tunneling dielectric layer 110, the first hard mask 210 is formed on the floating gate layer 200, and the second hard mask 220 is formed on the first hard mask 210.

The substrate 100 may be, for example, a silicon wafer, a bulk semiconductor or a semiconductor-on-insulation (SOI) substrate. In general, the semiconductor-on-insulation substrate includes a layer of semiconductor material formed on an insulating layer. For example, the insulating layer may be a buried oxide (BOX) layer, a silicon oxide layer or a similar material which provides insulating layer on a silicon or glass substrate. Another type of the substrate 100 may include, for example, multiple layers substrate or a gradient substrate. The substrate 100 may be an elemental semiconductor including silicon or germanium. The substrate 100 may be a compound semiconductor including: for example, silicon carbide, gallium arsenide, gallium phosphide, indium phosphide, indium arsenide and/or indium antimonide, but the present disclosure is not limited thereto. The substrate 100 may be an alloy semiconductor including, for example, SiGe, GaAsP, AlInAs, AlGaAs, GaInAs, GaInP, and/or GaInAsP or any combination thereof, but the present disclosure is not limited thereto. The substrate 100 may be a doped or undoped semiconductor substrate.

The tunneling dielectric layer 110 may be or include an oxide, a nitride, an oxynitride, a combination thereof, or any other suitable dielectric material, but the disclosure is not limited thereto. The tunneling dielectric layer 110 may be, for example, a silicon oxide, a silicon nitride, a silicon oxynitride, a high dielectric constant (high-k) dielectric material, any other suitable dielectric material, or a combination thereof. The high dielectric constant dielectric material may be a metal oxide, a metal nitride, a metal silicide, a transition metal oxide, a transition metal nitride, a transition metal silicide, a metal oxynitride, a metal aluminate, a zirconium silicate, or a zirconium aluminate.

The tunneling dielectric layer 110 may be formed by a deposition process or a thermal oxidation process. The deposition process may include or may be a chemical vapor deposition (CVD) process, for example, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), atmospheric pressure chemical vapor deposition (APCVD), or any other suitable process.

The floating gate layer 200 may include polycrystalline silicon, amorphous silicon, a metal, a metal nitride, a conductive metal oxide, a combination thereof, or any other suitable material, but the present disclosure is not limited thereto. The floating gate layer 200 may be formed by a chemical vapor deposition, a sputtering, a resistance heating evaporation, an electron beam evaporation, or any other suitable deposition process.

The first hard mask 210 and the second hard mask 220 are formed on the floating gate layer 200. The first hard mask 210 and/or the second hard mask 220 may include an oxide, a nitride, an oxynitride, a carbide, or a combination thereof. It should be understood that, materials of the first hard mask 210 and the second hard mask 220 may be chosen appropriately according to the subsequent etching process parameters, so the embodiment of the present disclosure is not limited thereto. The first hard mask 210 may include oxide, and the second hard mask 220 may include nitride. The first hard mask 210 and/or the second hard mask 220 may be formed by a CVD deposition or any other suitable process. In some embodiments, the second hard mask 220 may be omitted or other hard masks may be further used.

The first hard mask 210 and the second hard mask 220 may be patterned based on a desired shape of the trench 300, after the formation of the first hard mask 210 and the second hard mask 220. In some embodiments, portions of the floating gate layer 200, the tunneling dielectric layer 110, and the substrate 100 are removed by an etching process with the first hard mask 210 and the second hard mask 220 as etching masks, to form the trench 300 in the floating gate layer 200, the tunneling dielectric layer 110 and the substrate 100. The aforementioned etching process may include a dry etching process, a wet etching process, or any other suitable etching process. The dry etching process may include a plasma etching, a plasma-free gas etching, a sputter etching, a ion milling, a reactive ion etching (RIE), but the present disclosure are not limited thereto. The wet etching process may include an etching process using an acidic solution, an alkaline solution, or a solvent to remove at least a portion of the structure to be removed. In addition, the etching process may also be only chemical etching, only physical etching, or any combination thereof.

The trench 300 is used to define active regions shown in the subsequent FIG. 15. In other words, a plurality of active regions may be separated from each other by the trench 300. The active regions may be provided with a floating gate layer 200 and a subsequently formed control gate layer. The trench 300 may be a shallow trench isolation (STI) structure. The trench 300 may penetrate the second hard mask 220, the first hard mask 210, the floating gate layer 200, and the tunneling dielectric layer 110, but does not penetrate the substrate 100.

As shown in FIG. 1, after the formation of the trench 300, a liner 310 and a first dielectric layer 320 are formed. The liner 310 may be conformally disposed in the trench 300, and the first dielectric layer 320 may be conformally disposed on the liner 310. The material and the forming process of the liner layer 310 and/or the first dielectric layer 320 may be the same as or different from that of the tunneling dielectric layer 110. The liner 310 may include an oxide, such as a high temperature oxide (HTO) or silicon oxide. The first dielectric layer 310 may include a nitride, such as silicon nitride. The liner layer 310 and/or the first dielectric layer 320 may be formed by a deposition process.

Figure 2:
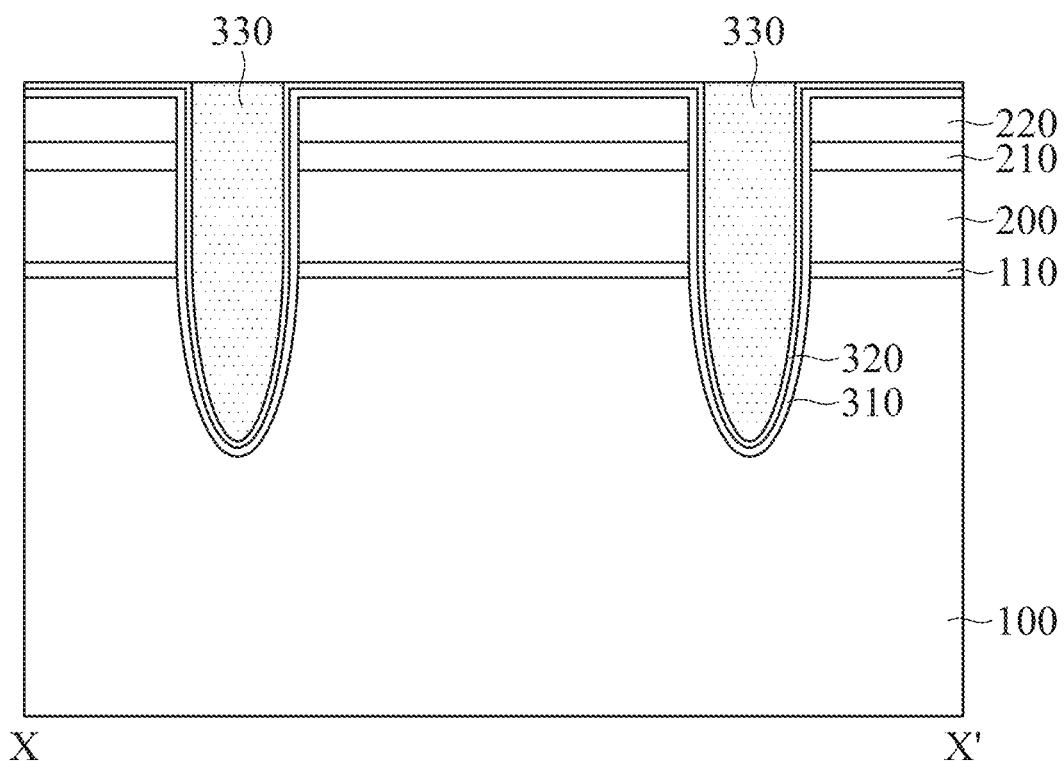

Referring to FIG. 2, a second dielectric layer 330 is formed on the first dielectric layer 320. The second dielectric layer 330 is blanketly formed on the first dielectric layer 320. The material and the forming process of the second dielectric layer 330 may be the same as or different from that of the tunneling dielectric layer 110. The second dielectric layer 330 may be formed by a high-density plasma chemical vapor deposition (HDP-CVD). After the formation of the second dielectric layer 330, a planarization process may be further performed so that the top surface of the second dielectric layer 330 is substantially aligned with the top surface of the first dielectric layer 320. The planarization process may be a chemical mechanical planarization (CMP) process.

The second dielectric layer 330 may include an oxide, for example, may be an oxide formed by using tetraethoxysilane (TEOS) as the precursor or silicon oxide. In some embodiments, the second dielectric layer 330 may be a porous oxide.

Figure 3:
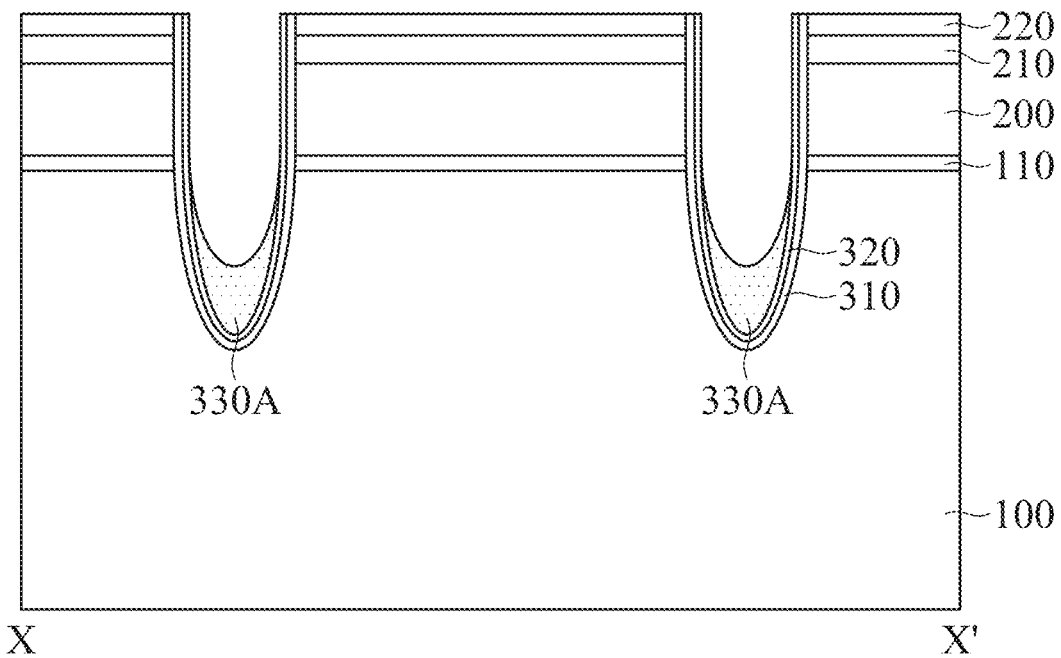

Referring to FIG. 3, a portion of the second dielectric layer 330 may be removed by a dry etching, to expose the first dielectric layer 320 in the trench 300 and remain the second dielectric layer 330A on the first dielectric layer 320. In some embodiments, the upper portion of the second dielectric layer 330 may be removed by a dry etching which may be a reactive ion etching process. Therefore, the size and shape of the second dielectric layer 330A remaining on the first dielectric layer 320 may be accurately controlled by performing a dry etching process, to control the size and shape of the subsequently formed air gap.

After performing the dry etching process, the first dielectric layer 320 adjacent to the upper portion of the trench 300 is exposed by the second dielectric layer 330A. The second dielectric layer 330A covers the first dielectric layer 320 adjacent to the lower portion of the trench 300. The top surface of the second dielectric layer 330A may be lower than, aligned with, or higher than the top surface of the tunneling dielectric layer 110. According to the requirements of the user, the height of the top surface of the second dielectric layer 330A may affect the size and shape of the subsequently formed air gap.

The second dielectric layer 330A may include an extending portion, and the extending portion extends upward. The extending portion of the second dielectric layer 330A is located toward the upper portion of the trench 300. The extending portion of the second dielectric layer 330A extends toward the subsequently formed dielectric stack. The width of the extending portion gradually decreased upward.

After performing the dry etching process, the second dielectric layer 330A has a concave top surface, such as a U-shaped top surface, a V-shaped top surface, a hole-shaped top surface, or the like. The second dielectric layer 330A has a convex bottom surface, such as a mountain-shape bottom surface. In some embodiments, the second dielectric layer 330A has a tip portion. The tip portion may be located between the first dielectric layer 320 and the subsequently formed third dielectric layer 340. In some embodiments, the upper portion of the second dielectric layer 330A is smaller than the bottom portion of the second dielectric layer 330A.

The etching rate of the second dielectric layer 330 may be greater than that of the liner 310, so that the second dielectric layer 330 may be more easily etched, to easily control the second dielectric layer 330A in size. The etching rate of the second dielectric layer 330 may be greater than that of the first dielectric layer 320. Thus, when a portion of the second dielectric layer 330 is removed by the dry etching, damage to the first dielectric layer 320 in the trench 300 may be avoided. In other words, the first dielectric layer 320 may be used as an etch stop layer when the second dielectric layer 330 is etched. In some embodiments, the liner layer 310 and the first dielectric layer 320 on the top surface of the second hard mask 220 may be further removed, to expose the top surfaces of the second hard mask 220, the liner layer 310, and the first dielectric layer 320.

Figure 4:
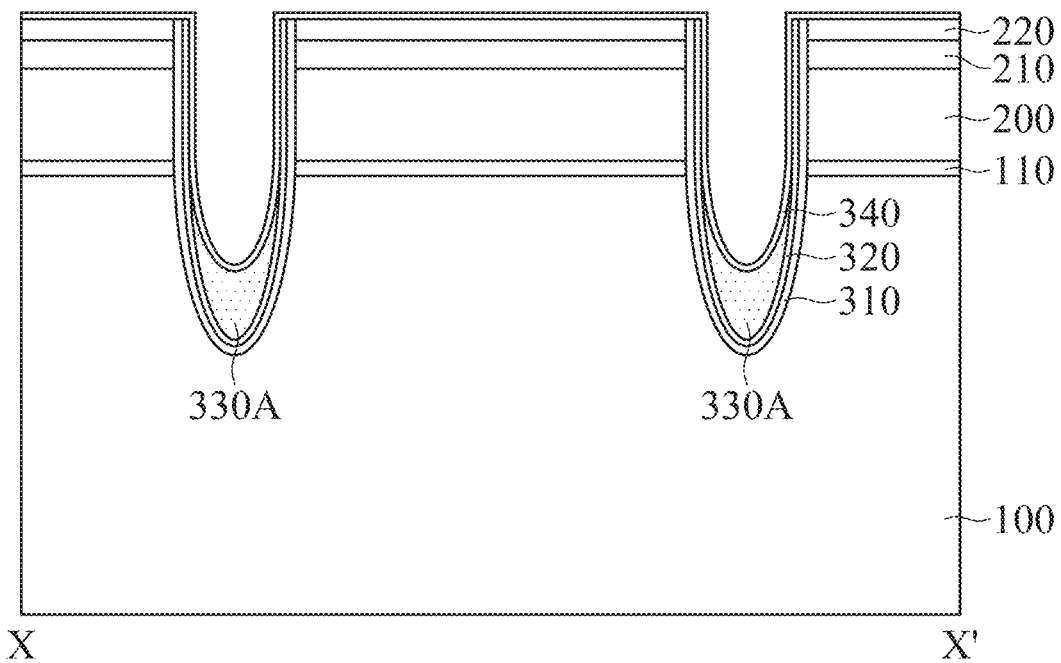

Referring to FIG. 4, a third dielectric layer 340 is formed on the second dielectric layer 330. The third dielectric layer 340 is conformally formed on the second hard mask 220, the liner 310, the first dielectric layer 320 and the second dielectric layer 330A. The first dielectric layer 320, the second dielectric layer 330, and the third dielectric layer 340 are in contact with each other. The first dielectric layer 320 and the third dielectric layer 340 surround the second dielectric layer 330A. The first dielectric layer 320 directly covers the bottom surface of the second dielectric layer 330A, and the third dielectric layer 340 directly covers the top surface of the second dielectric layer 330A. Since the third dielectric layer 340 is conformally formed on the second dielectric layer 330A, the third dielectric layer 340 may have a shape corresponding to the second dielectric layer 330A.

The material and the forming process of the third dielectric layer 340 may be the same as or different from that of the tunneling dielectric layer 110. The third dielectric layer 340 may include nitride, such as silicon nitride. In some embodiments, since the first dielectric layer 320 and the third dielectric layer 340 are both silicon nitride, the first dielectric layer 320 and the third dielectric layer 340 may not substantially have an interface therebetween. In some embodiments, the third dielectric layer 340 may be formed by atomic layer deposition.

The liner 310 and the second dielectric layer 330 may include oxide, and the first dielectric layer 320 and the third dielectric layer 340 may include nitride. Therefore, in the trench 300 as shown in FIG. 1, layers with different etching rates may be alternately disposed in the trench 300. Wherein, the etching rate of each layer in the trench 300 may be alternately high and low. In some embodiments, the etching rate of the liner 310 is greater than that of the first dielectric layer 320, the etching rate of the first dielectric layer 320 is less than that of the second dielectric layer 330, and the etching rate of the second dielectric layer 330 is greater than that of the third dielectric layer 340. Thus, the present disclosure can control the shape of the subsequently formed air gap by using a layer with a high etching rate. Also, it can provide a supporting force in the subsequently formed semiconductor structure by using a layer with a low etching rate as an etch stop layer.

Figure 5:
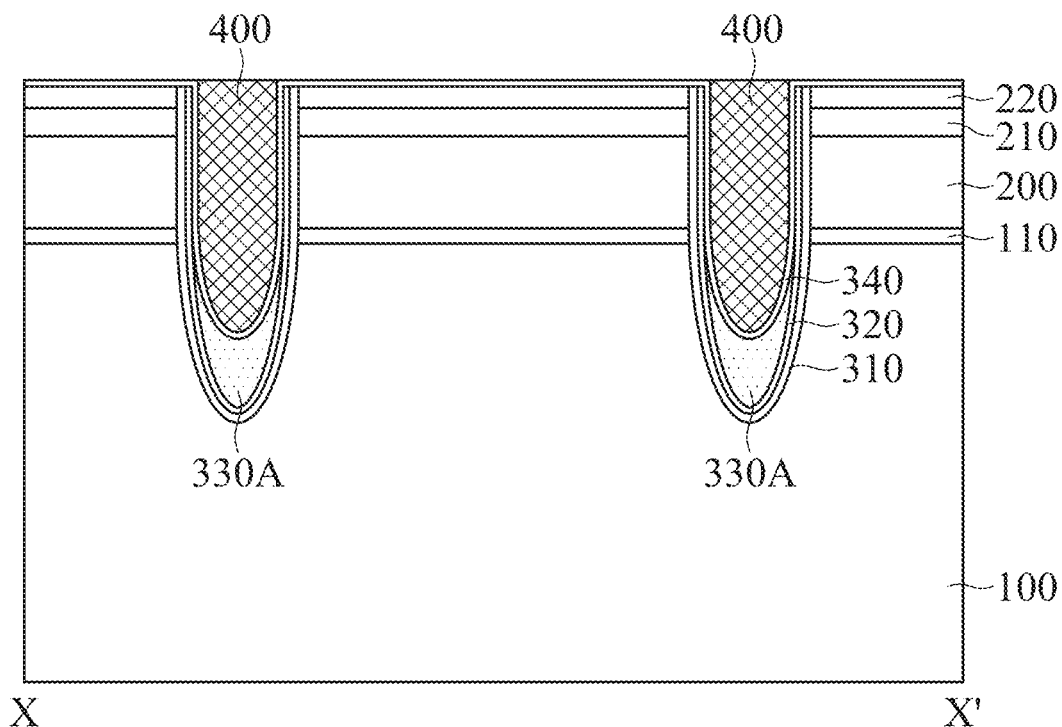

Referring to FIG. 5, a first sacrificial layer 400 is formed on the third dielectric layer 340. The first sacrificial layer 400 is blanketly formed on the third dielectric layer 340. The material and the forming process of the first sacrificial layer 400 may be the same as or different from that of the second dielectric layer 330. After the formation of the first sacrificial layer 400, a planarization process may be further performed so that the top surface of the first sacrificial layer 400 is substantially aligned with the top surface of the third dielectric layer 340. The first sacrificial layer 400 may be an oxide formed by using tetraethoxysilane as a precursor, or may be a spin-on glass (SOG) oxide. In some embodiments, the first sacrificial layer 400 may be a porous oxide formed by using tetraethoxysilane as a precursor.

Figure 6:
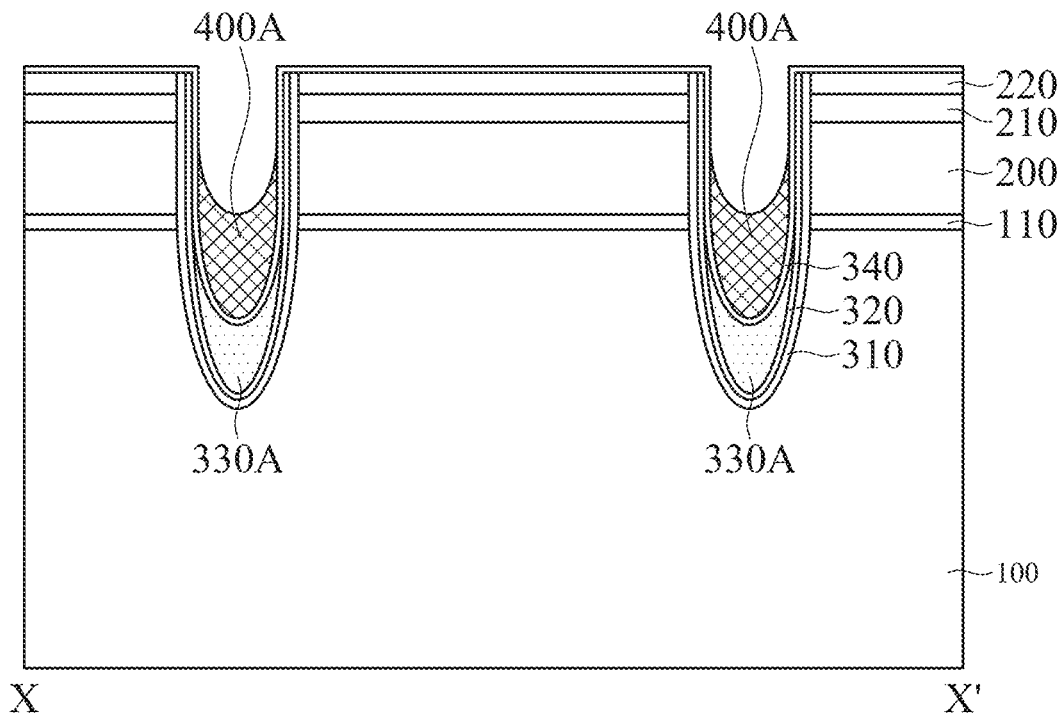

Referring to FIG. 6, a portion of the first sacrificial layer 400 is removed by dry etching, in order to expose the third dielectric layer 340 in the trench 300 and remain the first sacrificial layer 400A on the third dielectric layer 340. The dry etching process may be a dry etching process with SiCoNi etching technology. Wherein, the SiCoNi etching technology is remote plasma enhanced dry etching process. Therefore, the size and the shape of the first sacrificial layer 400A remaining on the third dielectric layer 340 can be accurately controlled by performing the dry etching process. In some embodiments, the shape of the first sacrificial layer 400A corresponds to the shape of the second dielectric layer 330A. In some embodiments, the first sacrificial layer 400A has a concave top surface. In some embodiments, the top surface of the first sacrificial layer 400A is lower than the top surface of the floating gate layer 200.

Figure 7:
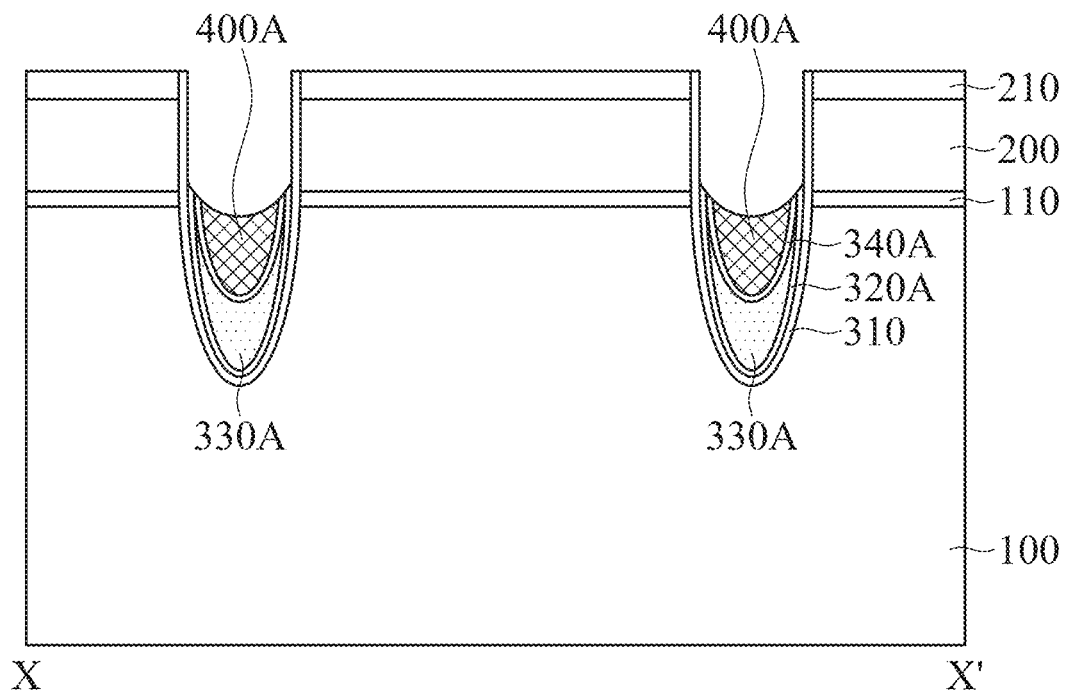

Referring to FIG. 7, portions of the third dielectric layer 340 and the first dielectric layer 320 are removed with the first sacrificial layer 400A as an etching mask, so that the top portion of the liner 310 in the trench 300 is exposed by the first dielectric layer 320A and the third dielectric layer 340A. In some embodiments, the first dielectric layer 320A, the third dielectric layer 340A, and the first sacrificial layer 400A are substantially coplanar. In some embodiments, top surfaces of the first dielectric layer 320A, the third dielectric layer 340A, and the first sacrificial layer 400A are lower than the top surface of the liner 310. In some embodiments, the third dielectric layer 340 and the second hard mask 220 on the top surface of the floating gate layer 200 may be further removed.

Figure 8:
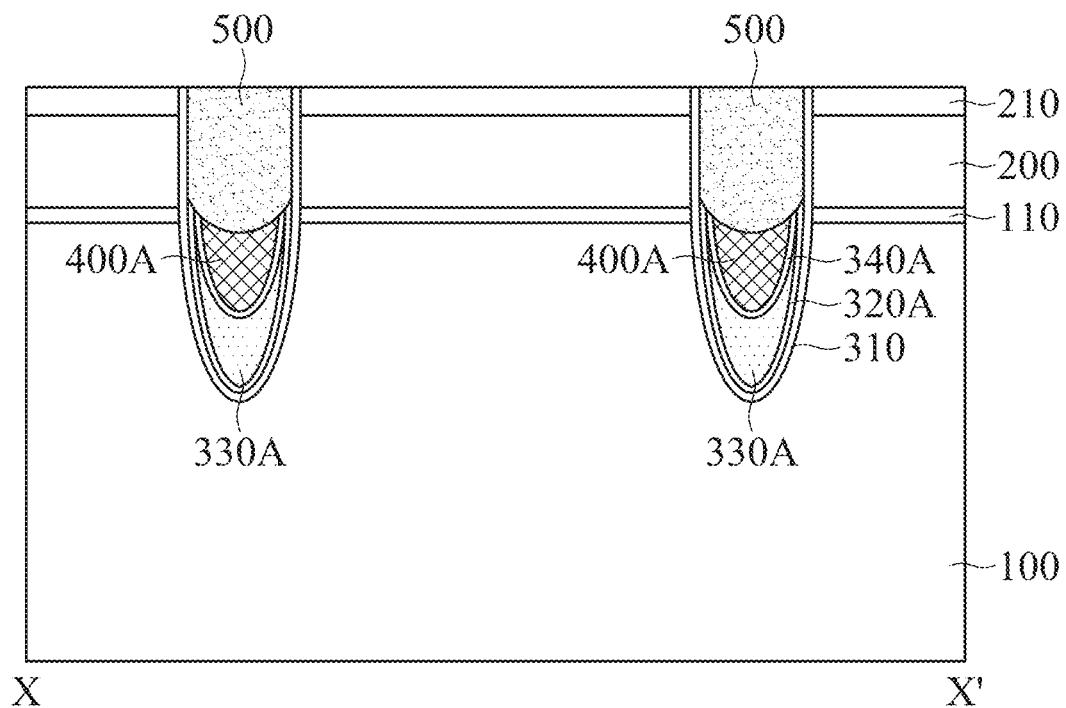

Referring to FIG. 8, a second sacrificial layer 500 may be formed on the first sacrificial layer 400A. The second sacrificial layer 500 is blanketly formed on the first dielectric layer 320A, the third dielectric layer 340A, and the first sacrificial layer 400A. The material and the forming process of the second sacrificial layer 500 may be the same as or different from that of the first sacrificial layer 400. After the formation of the second sacrificial layer 500, a planarization process may be further performed so that the top surface of the second sacrificial layer 500 is substantially aligned with the top surfaces of the liner 310 and the first hard mask 210. The second sacrificial layer 500 may be a porous oxide formed by using tetraethoxysilane as a precursor. In some embodiments, the second sacrificial layer 500 may be spin-on glass (SOG) oxide. In some embodiments, since both the first sacrificial layer 400A and the second sacrificial layer 500 are porous oxides, the first sacrificial layer 400A and the second sacrificial layer 500 may not substantially have an interface therebetween. In the present embodiment, the second dielectric layer 330A may also be a porous oxide.

Figure 9:
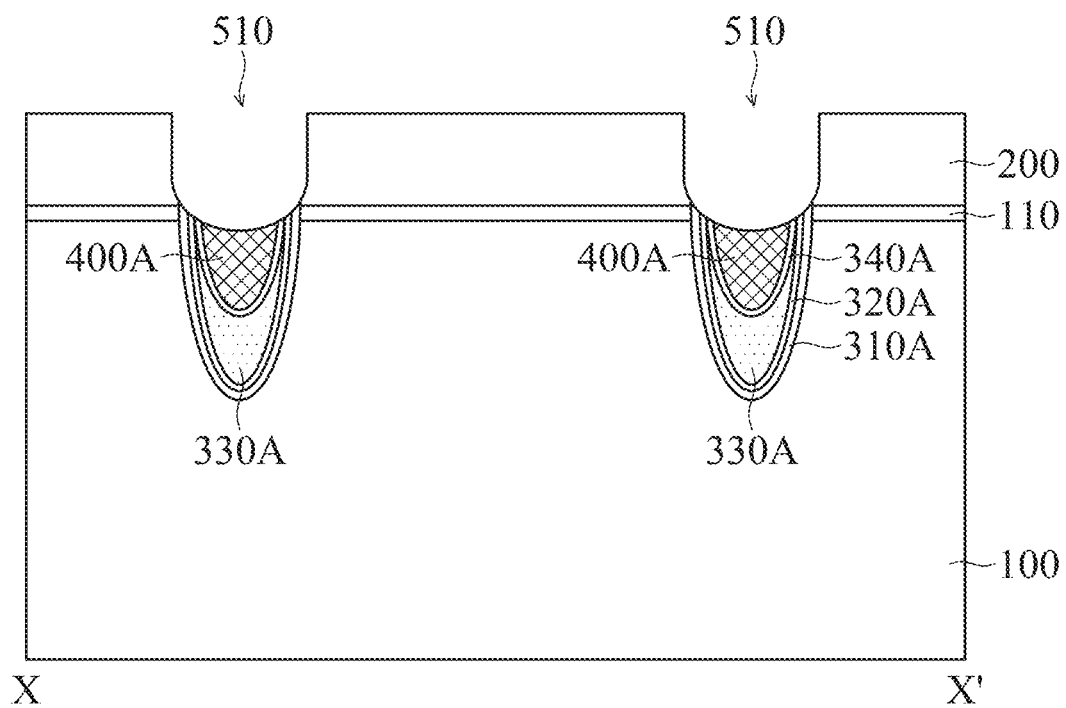

Referring to FIG. 9, the second sacrificial layer 500 and the first hard mask 210 on the floating gate layer 200 are removed to expose the floating gate layer 200. In some embodiments, the upper portion of the liner 310 is removed, and the liner 310A is remained. The second sacrificial layer 500 and the first hard mask 210 may be removed by radio frequency plasma etching and SiCoNi etching technology.

In some embodiments, the second sacrificial layer 500 may be completely removed, and the first sacrificial layer 400A may be remained. In other embodiments, a portion of the second sacrificial layer 500 may be removed, and another portion of the second sacrificial layer 500 may be remained on the first sacrificial layer 400A. It should be understood that the degree of removal of the first sacrificial layer 400A can be adjusted according to the subsequent electrical requirements.

As shown in FIG. 9, in some embodiments, a portion of the floating gate layer 200 may be further removed to form an opening 510 in the floating gate layer 200. In some embodiments, the opening 510 may be formed by a dry etching. In some embodiments, the width of the opening 510 is greater than the width of the trench 300 shown in FIG. 1. The opening 510 can be used to define the size of the subsequently formed control gate.

Figure 10:
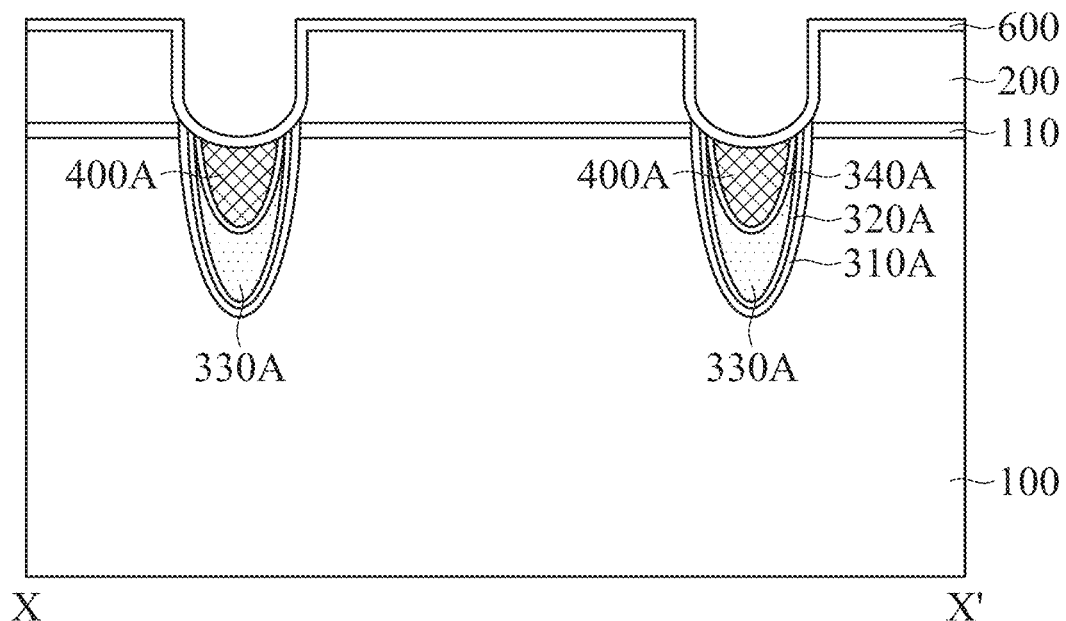

Referring to FIG. 10, a dielectric stack 600 is formed on the first sacrificial layer 400A. The dielectric stack 600 is conformally formed on the opening 510. The dielectric stack 600 is conformally formed on the floating gate electrode layer 200, the liner 310A, the first dielectric layer 320A, the third dielectric layer 340A, and the first sacrificial layer 400A. Compared with the dielectric stack 600 on the first sacrificial layer 400A, the dielectric stack 600 on the floating gate layer 200 is farer away from the substrate 100. The dielectric stack 600 may be used as a control dielectric layer in a subsequently formed memory device.

The dielectric stack 600 may include a first sub-layer, a second sub-layer, and a third sub-layer. The first sub-layer may be disposed on the first sacrificial layer 400A. The second sub-layer may be disposed on the first sub-layer. The third sub-layer may be disposed on the second sub-layer. Wherein, the first sub-layer and the third sub-layer may include oxide, and the second sub-layer may include nitride. Thus, the dielectric stack 600 may be an oxide-nitride-oxide (ONO) structure.

In another embodiment, the dielectric stack 600 may further include a bottom layer and a top layer. The bottom layer may be disposed between the first sacrificial layer 400A and the first sub-layer. The top layer may be disposed between the third sub-layer and the subsequently formed control gate layer. Wherein, the bottom layer and the top layer of the dielectric stack 600 may include nitride. Thus, the dielectric stack 600 may be a nitride-oxide-nitride-oxide-nitride (NONON) structure. In yet another embodiment, the dielectric layer stack 600 may only include silicon nitride or silicon oxide.

Figure 11:
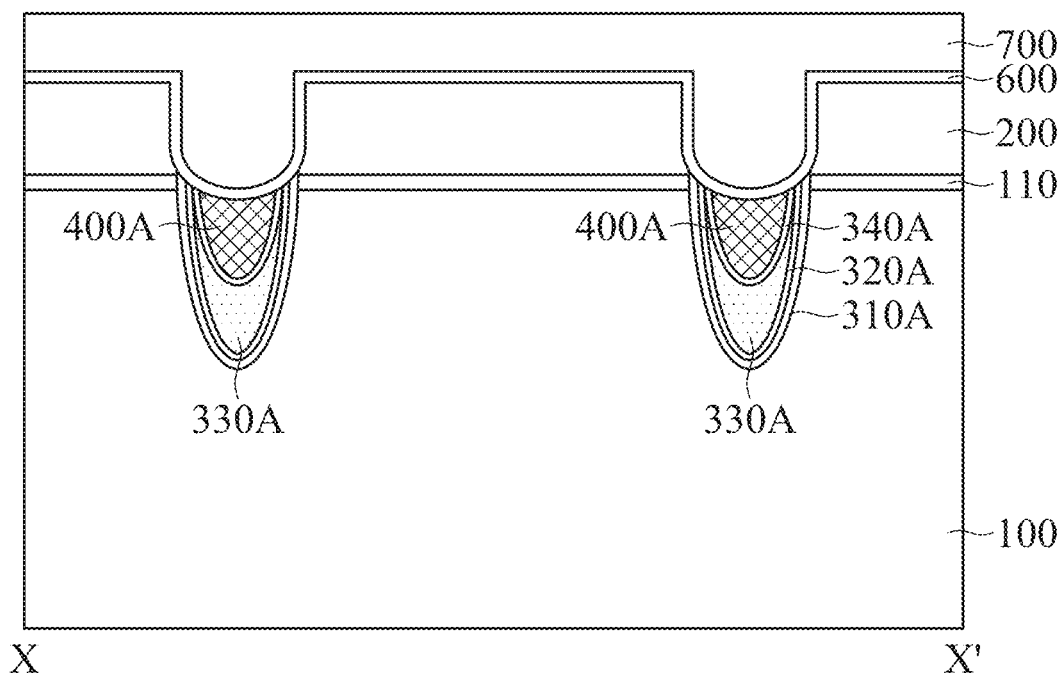
Figure 12:
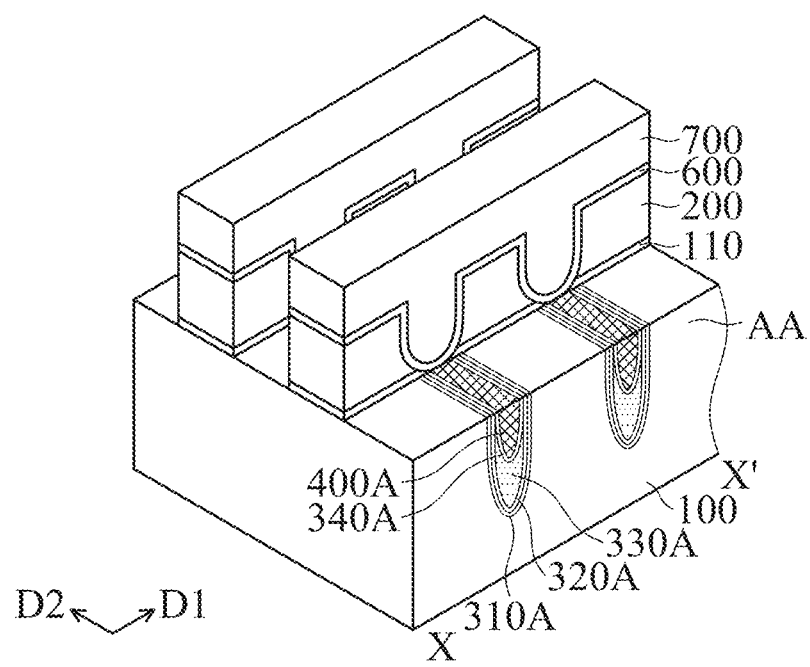
FIG. 12 is a schematic three-dimensional view of a semiconductor structure according to some embodiments of the disclosure.

Referring to FIG. 11, a control gate layer 700 may be formed on the dielectric stack 600. The control gate layer 700 is blanketly formed on the dielectric stack 600. The material and the forming process of the control gate layer 700 may be the same as or different from that of the floating gate layer 200. The control gate layer 700 may include polysilicon.

As shown in FIG. 12, a double patterning process may be performed on the control gate layer 700. In some embodiments, a patterned hard mask may be formed on the control gate layer 700 so as to pattern the control gate layer 700 to form a word line WL as shown in sequent FIG. 15. According to requirements, the word line WL may further include other layers or components. The patterned control gate layer 700 may extend along a first direction D1 and may be arranged at intervals in a second direction D2. In some embodiments, spacers may be further formed on the sidewalls of the control gate layer 700 to reduce leakage current.

Figure 13:
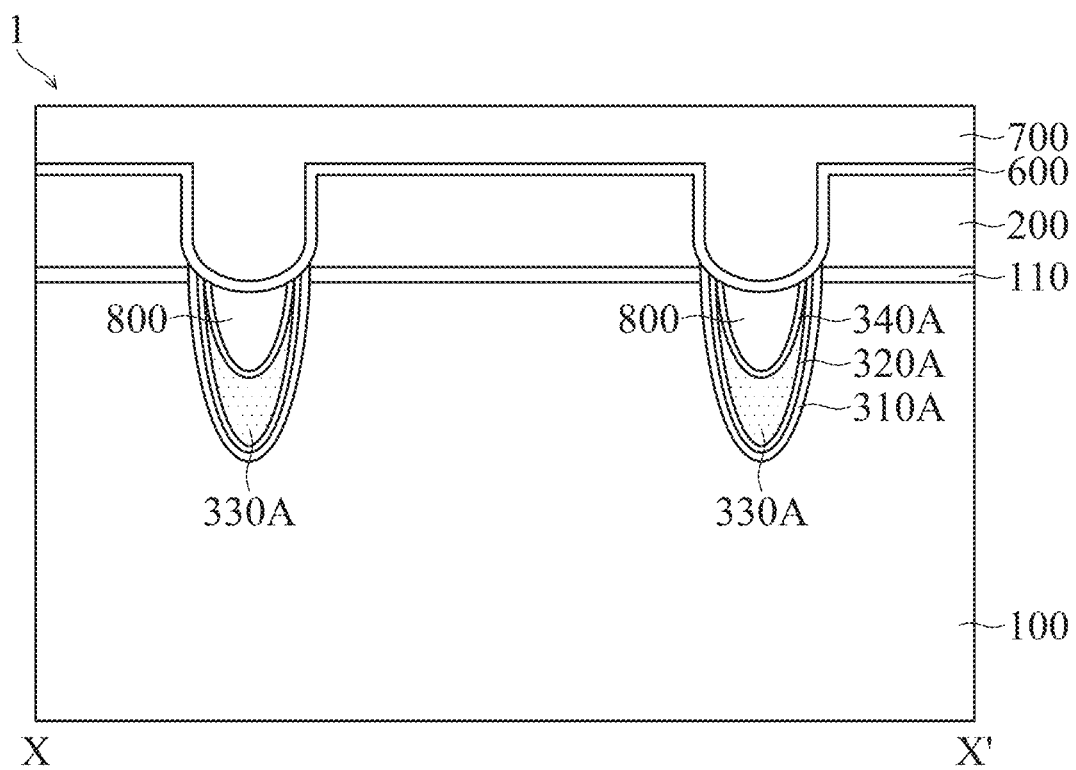
FIG. 13 is a schematic cross-sectional view of a semiconductor structure according to some embodiments of the disclosure.

Referring to FIG. 13, after the formation of the control gate layer 700 on the dielectric stack 600, the first sacrificial layer 400A between the third dielectric layer 340A and the dielectric stack 600 is removed by a wet etching process. Thus, a semiconductor structure 1 with an air gap 800 is obtained. In some embodiments, the first sacrificial layer 400A is completely removed by the wet etching process. The third dielectric layer 340A and the dielectric stack 600 are used as an etch stop layer. In addition, the air gap 800 is formed at the location corresponding to the first sacrificial layer 400A to obtain a semiconductor structure 1.

In some embodiments, the shape of the air gap 800 is same as the shape of the first sacrificial layer 400A. In some embodiments, the air gap 800 has a concave top surface and a convex bottom surface. In some embodiments, the air gap 800 has a tip portion. In some embodiments, the tip portion of the air gap 800 is smoother than the tip portion of the second dielectric layer 330A. In some embodiments, the air gap 800 has an extending portion extending upwardly. The width of the extending portion of the air gap 800 gradually decreases upwardly.

The air gap 800 is formed on the third dielectric layer 340A, and is formed between the third dielectric layer 340A and the dielectric stack 600. In some embodiments, the air gap 800 is in direct contact with the third dielectric layer 340A and the dielectric stack 600, and the air gap 800 is surrounded by the third dielectric layer 340A and the dielectric stack 600. In other words, an air gap 800 is formed in the space formed by the third dielectric layer 340A and the dielectric stack 600. In some embodiments, the air gap 800 may be filled with air or other suitable gas, or the air gap 800 may be vacuum.

In some embodiments, the air gap 800 is supported by the second dielectric layer 330A below the air gap 800. Thus, a depth of the air gap 800 in the trench 300 shown in FIG. 1 may be adjusted by varying the thickness of the second dielectric layer 330A. In some embodiments, when the thickness of the second dielectric layer 330A is thinner, the depth of the air gap 800 in the trench 300 shown in FIG. 1 is deeper.

In some embodiments, the etching rate of the first sacrificial layer 400A is greater than the etching rate of the third dielectric layer electrically 340A and the etching rate of the dielectric stack 600. Thus, the first sacrificial layer 400A is removed while the reliability of the third dielectric layer 340A and the dielectric stack 600 is maintained. That is, the etching rate of the first sacrificial layer 400A is greater than the etching rate of the third dielectric layer 340A, and the etching rate of the first sacrificial layer 400A is greater than the etching rate of a layer in the dielectric stack 600 which is in direct contact with the first sacrificial layer 400A.

In the case where the dielectric stack 600 has an ONO structure, the first sub-layer of the dielectric stack 600 is in direct contact with the first sacrificial layer 400A. Accordingly, the etching rate of the first sacrificial layer 400A is greater than the etching rate of the first sub-layer of the dielectric stack 600, and the etching rate of the first sacrificial layer 400A is greater than the etching rate of the third dielectric layer 340A, so as to ensure the reliability of the dielectric stack 600 and the third dielectric layer 340A.

In the case where the dielectric stack 600 has an NONON structure, the bottom layer of the dielectric stack 600 is in direct contact with the first sacrificial layer 400A. Accordingly, the etching rate of the first sacrificial layer 400A is greater than the etching rate of the bottom layer of the dielectric stack 600, and the etching rate of the first sacrificial layer 400A is greater than the etching rate of the third dielectric layer 340A, so as to ensure the reliability of the dielectric stack 600 and the third dielectric layer 340A.

It should be noted that, as shown in FIG. 13, the first dielectric layer 320A and the third dielectric layer 340A are disposed adjacent to the air gap 800. Thus, even the first sacrificial layer 400A below the dielectric stack 600 has been removed to form the air gap 800, the first dielectric layer 320A and the third dielectric layer 340A still provide sufficiently supporting force for the dielectric stack 600.

It should be also noted that, the shape and the size of the air gap 800 are based on the shape and the size of the first sacrificial layer 400A, and the shape and the size of the first sacrificial layer 400A are based on the shape and the size of the second dielectric layer 330A. Therefore, when the second dielectric layer 330A is formed by performing a precise dry etching process, the present disclosure can accurately form the first sacrificial layer 400A. That is, the present disclosure can accurately form the air gap 800. Further, since the air gap 800 of the present disclosure is formed by the dry etching process, it is possible to easily adjust the parameters of the dry etching process to adjust the air gap 800. Thus, the present disclosure can provide air gaps 800 with various shapes and sizes, thereby improving the adjustability of the forming process of the air gap 800.

In some embodiments, further processes may be performed on the semiconductor structure 1 shown in FIG. 13 to form a memory device. As shown in FIG. 14, in some embodiments, the area between the trenches 300 shown in FIG. 1 is the active area AA. In some embodiments, the etchant of the aforementioned wet etching process may flow along a direction parallel to the extending direction of the active area AA to remove the first sacrificial layer 400A, in order to form the air gap 800. In some embodiments, the air gap 800 is disposed between adjacent active areas AA, and the air gap 800 is not disposed in the active areas AA. In some embodiments, the air gaps 800 extend along the second direction D2 and are arranged at intervals in the first direction D1. In some embodiments, the air gap 800 may be directly disposed under the dielectric stack 600 to avoid coupling interference between the active areas AA and avoid the generation of leakage current.

Referring to FIG. 15, in some embodiments, the air gap 800 shown in FIG. 14 may be disposed in the region R1 shown in FIG. 15, and the extending direction of the air gap 800 is perpendicular to the extending direction of the word line WL. In some embodiments, the extending direction of the air gap 800 is parallel to the extending direction of the active area AA.

In some embodiments, a capping layer may be further formed on the word line WL. The capping layer may include oxide. The capping layer may be formed by a chemical vapor deposition process. The capping layer may include a material with a high step coverage rate to completely cover the region R1 shown in FIG. 15. The capping layer can prevent the components disposed under the capping layer from being exposed, and can provide supporting force to the semiconductor structure.

In summary, since the semiconductor structure of the present disclosure includes an air gap, it can effectively reduce the coupling interference between active areas and avoid the generation of leakage current. At the same time, the present disclosure sequentially disposes the first dielectric layer, the second dielectric layer, the third dielectric layer, the air gap, and the dielectric stack to form a semiconductor structure with multiple dielectric layers and the dielectric stack.

The air gap is directly between the third dielectric layer and the dielectric stack, and the etching rate of the first sacrificial layer is greater than the etching rates of the third dielectric layer and the dielectric stack. Therefore, when the air gap is formed by the wet etching process, the integrity and reliability of the third dielectric layer and the dielectric stack may still be maintained. In addition, the first sacrificial layer is completely surrounded by the third dielectric layer and the dielectric stack. Therefore, when the air gap is formed by the wet etching process, the etching time and the concentration of the etchant may not be limited by the third dielectric layer and the dielectric stack to be shortened or decreased. Therefore, the process margin and the process window for performing the wet etching process can be improved.

Moreover, the forming method of the present disclosure avoids the problem of easily damaging the integrity of the air gap and the control gate layer when the air gap is formed first and then the control gate layer is formed on the air gap. For example, since the present disclosure first disposes components such as the first sacrificial layer at the predetermined position of the air gap, it can help to form a high quality control gate layer on the first sacrificial layer, thereby ensuring the reliability of the control gate layer.

Moreover, the shape and the size of the air gap in the present disclosure correspond to the shape and the size of the second dielectric layer, and the second dielectric layer is precisely formed by the dry etching process. Therefore, the present disclosure can easily control the shape and the size of the air gap by controlling the parameters of the dry etching process. Further, since the liner, the first dielectric layer, and the third dielectric layer are adjacent to the top portion of the trench, the supporting force of the dielectric stack is enhanced and the reliability of the semiconductor structure is maintained.

For example, when there is an air gap under the dielectric stack, the supporting force for the dielectric stack can be provided by the liner, the first dielectric layer and the third dielectric layer adjacent to the air gap, so as to prevent the dielectric stack from damaging. At the same time, the forming method provided in the present disclosure can be applied to existing semiconductor manufacturing equipment, so the cost of the forming method can be reduced. In summary, the present disclosure can provide a semiconductor structure with high reliability and excellent performance and a method for forming the same.

A person of ordinary skill in the art should understand that they can design or modify other manufacturing processes and structures based on the embodiments of the present disclosure to achieve the same purpose and/or advantages as the embodiments described herein, and they can make all kinds of changes, substitutions and replacements without departing from the spirit and scope of the present disclosure.

What is claimed is:

1. A method of forming a semiconductor structure, comprising:
    forming a floating gate layer on a substrate;
    forming a trench in the floating gate layer and the substrate;
    forming a first dielectric layer in the trench;
    forming a second dielectric layer on the first dielectric layer;
    forming a third dielectric layer on the second dielectric layer;
    forming a first sacrificial layer on the third dielectric layer;
    forming a dielectric stack on the first sacrificial layer;

forming a control gate layer on the dielectric stack; and
removing the first sacrificial layer to form an air gap between the third dielectric layer and the dielectric stack,
wherein the first dielectric layer, the second dielectric layer and the third dielectric layer are in contact with each other,
wherein the air gap has a concave top surface and a convex bottom surface, and
wherein a tip portion of the air gap is smoother than a tip portion of the second dielectric layer.

2. The method as claimed in claim 1, wherein the formation of the second dielectric layer on the first dielectric layer further comprises:
blanketly forming the second dielectric layer on the first dielectric layer; and
removing a portion of the second dielectric layer to expose the first dielectric layer in the trench.

3. The method as claimed in claim 2, wherein the third dielectric layer is conformally formed on the floating gate layer, the first dielectric layer and the second dielectric layer.

4. The method as claimed in claim 2, wherein the portion of the second dielectric layer is removed by a dry etching process.

5. The method as claimed in claim 2, wherein an etching rate of the second dielectric layer is greater than an etching rate of the first dielectric layer.

6. The method as claimed in claim 1, further comprising:
forming a liner on the trench, wherein the liner is between the substrate and the first dielectric layer, and wherein the formation of the first sacrificial layer on the third dielectric layer further comprises:
blanketly forming the first sacrificial layer on the third dielectric layer;
removing a portion of the first sacrificial layer to expose the third dielectric layer in the trench; and
removing the third dielectric layer, the first dielectric layer and the liner to expose the floating gate layer.

7. The method as claimed in claim 6, wherein the portion of the first sacrificial layer is removed by a dry etching process.

8. The method as claimed in claim 6, wherein the removal of the third dielectric layer, the first dielectric layer and the liner further comprises:
removing the third dielectric layer and the first dielectric layer with a remaining portion of the first sacrificial layer as a mask, to expose the liner;
forming a second sacrificial layer on the remaining portion of the first sacrificial layer;
removing the second sacrificial layer and the liner to expose the floating gate layer.

9. The method as claimed in claim 8, wherein the removal of the second sacrificial layer and the liner further comprises:

removing a portion of the floating gate layer to form an opening in the floating gate layer, wherein a width of the opening is greater than a width of the trench.

10. The method as claimed in claim 8, wherein the dielectric stack is conformally formed on the floating gate layer, the liner, the first dielectric layer, the third dielectric layer and the remaining portion of the first sacrificial layer.

11. The method as claimed in claim 1, wherein the first sacrificial layer is removed by a wet etching process after the formation of the dielectric stack on the first sacrificial layer.

12. The method as claimed in claim 1, wherein an etching rate of the first sacrificial layer is greater than an etching rate of the third dielectric layer and an etching rate of the dielectric stack.

13. A semiconductor structure, comprising:
a substrate having a trench between a plurality of active regions;
a first dielectric layer disposed in the trench;
a second dielectric layer disposed on the first dielectric layer;
a third dielectric layer disposed on the second dielectric layer; and
a dielectric stack disposed on the third dielectric layer, wherein an air gap is between the third dielectric layer and the dielectric stack,
wherein the first dielectric layer, the second dielectric layer and the third dielectric layer are in contact with each other,
wherein the air gap has a concave top surface and a convex bottom surface, and
wherein a tip portion of the air gap is smoother than a tip portion of the second dielectric layer.

14. The semiconductor structure as claimed in claim 13, wherein the air gap is in direct contact with the third dielectric layer and the dielectric stack.

15. The semiconductor structure as claimed in claim 13, wherein the air gap is surrounded by the third dielectric layer and the dielectric stack.

16. The semiconductor structure as claimed in claim 13, wherein the second dielectric layer comprises oxide and the first dielectric layer and the third dielectric layer comprise nitride.

17. The semiconductor structure as claimed in claim 13, wherein the second dielectric layer has a concave top surface and/or a convex bottom surface.

18. The semiconductor structure as claimed in claim 13, wherein the second dielectric layer has a tip portion.

19. The semiconductor structure as claimed in claim 13, wherein the second dielectric layer comprises an extending portion which extends upward, wherein a width of the extending portion gradually decreases upward.

* * * * *